(12) United States Patent
Fukami et al.

(10) Patent No.: US 9,095,071 B2
(45) Date of Patent: Jul. 28, 2015

(54) MULTILAYER WIRING BOARD AND METHOD FOR MANUFACTURING THE SAME

(71) Applicant: Kabushiki Kaisha Nihon Micronics, Tokyo (JP)

(72) Inventors: Yoshiyuki Fukami, Tokyo (JP); Toshinori Omori, Tokyo (JP); Katsushi Mikuni, Tokyo (JP); Noriko Kon, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 62 days.

(21) Appl. No.: 14/079,381

(22) Filed: Nov. 13, 2013

(65) Prior Publication Data

US 2014/0138139 A1    May 22, 2014

(30) Foreign Application Priority Data

Nov. 20, 2012  (JP) ................................. 2012-254337

(51) Int. Cl.
| | |
|---|---|
| *H05K 1/16* | (2006.01) |
| *H01L 21/48* | (2006.01) |
| *H01L 23/498* | (2006.01) |
| *G01R 31/28* | (2006.01) |
| *H05K 1/02* | (2006.01) |
| *G01R 1/073* | (2006.01) |
| *G01R 3/00* | (2006.01) |

(52) U.S. Cl.
CPC ............ *H05K 1/167* (2013.01); *G01R 1/07378* (2013.01); *G01R 31/2891* (2013.01); *H01L 21/4857* (2013.01); *H01L 23/49822* (2013.01); *G01R 1/07342* (2013.01); *G01R 3/00* (2013.01); *H05K 1/0298* (2013.01); *H05K 2201/0317* (2013.01); *Y10T 29/49004* (2015.01)

(58) Field of Classification Search
CPC .......... H01K 1/16; H01K 1/167; H01L 21/70; H01L 21/707; H01L 27/01; H01L 27/016; H01C 1/012; H01C 1/148; H01C 3/04; H01C 7/003; H01C 7/006; H01C 7/13; H01C 17/06; H01C 17/075; H01C 17/12; H01C 17/167
USPC ............... 174/260; 29/610.1, 603.07, 603.09, 29/620; 216/16; 338/308, 309; 257/310, 257/533, 537, 904
See application file for complete search history.

(56) References Cited

U.S. PATENT DOCUMENTS

| | | | | |
|---|---|---|---|---|
| 4,347,479 | A * | 8/1982 | Cullet ........................... | 324/716 |
| 2002/0088109 | A1* | 7/2002 | Santini ....................... | 29/603.09 |
| 2010/0156449 | A1 | 6/2010 | Nitta et al. | |
| 2011/0063072 | A1* | 3/2011 | Lo et al. ....................... | 338/314 |

FOREIGN PATENT DOCUMENTS

JP        2010-151497        7/2010

* cited by examiner

*Primary Examiner* — Xiaoliang Chen
(74) *Attorney, Agent, or Firm* — Procopio, Cory, Hargreaves & Savitch LLP

(57) ABSTRACT

Provided is a method for manufacturing a multi-layer wiring board and the multi-layer wiring board that are capable of suppressing variation in resistance values. The method according to the present invention is the method for manufacturing a multi-layer wiring board. The method includes forming a resistor thin film, measuring resistance distribution of the resistor thin film, calculating resistor width adjustment rates of the plurality of resistors according to the resistance distribution, forming a pattern of a protective film on the resistor thin film, in which the pattern of the protective pattern has pattern width according to the resistor width adjustment rate, forming a pattern of a plating film on the resistor thin film at a position exposed from the protective film, and etching the resistor thin film at a position exposed from the plating film and the protective film so as to pattern the resistor thin film.

6 Claims, 8 Drawing Sheets

MULTILAYER WIRING BOARD AND METHOD FOR MANUFACTURING THE SAME

CROSS-REFERENCE TO RELATED APPLICATION(S)

This application claims the benefit of Japanese Patent Application No. 2012-254337, filed Nov. 20, 2012, the disclosure of which is hereby incorporated by reference in its entirety.

BACKGROUND OF THE INVENTION

1. Field of the Invention

The present invention relates to a multi-layer wiring board and a method for manufacturing the same.

2. Description of Related Art

A probe card is used for testing a semiconductor device and the like. For example, a plurality of probes provided to a probe card come into contact with electrodes (pads) of a semiconductor device to thereby supply power from a tester and the like to the semiconductor device.

Japanese Unexamined Patent Application Publication No. 2010-151497 discloses a probe card including a multi-layer wiring board. The probe card disclosed in Japanese Unexamined Patent Application Publication No. 2010-151497 includes a ceramic base plate and also a plurality of power supply paths. In the ceramic base plate, first layers including heating elements and second layers including conductive paths are laminated.

In such a probe card, a resistor having a predetermined resistance value may be used for impedance matching and the like. There have been requests for reducing in-plane variation in resistance values to be less than or equal to a standard value when a resistor is formed to a multi-layer wiring board used for a probe card. However, there is a problem that the variation in the resistance values may not satisfy the standard value.

The present invention is made in view of the above-mentioned issue, and an object of the present invention is to provide a method for manufacturing a multi-layer wiring board and the multi-layer wiring board that are capable of suppressing the variation in the resistance values.

SUMMARY OF THE INVENTION

An aspect of the present invention is a method for manufacturing a multi-layer wiring board including a plurality of wiring layers and a plurality of resistors formed on a topmost wiring layer. The method includes: forming a resistor thin film; measuring resistance distribution of the resistor thin film; calculating resistor width adjustment rates of the plurality of resistors according to the resistance distribution; forming a pattern of a protective film above the resistor thin film, in which the pattern of the protective pattern has pattern width according to the resistor width adjustment rate; forming a pattern of a plating film above the resistor thin film at a position exposed from the protective film; and etching the resistor thin film at a position exposed from the plating film and the protective film so as to pattern the resistor thin film.

In the above-mentioned method, in the forming of the pattern of the plating film, a resist pattern may be formed above the protective film and the resistor thin film, and the plating film may be formed in an opening of the resist pattern.

In the above-mentioned method, the resistor thin film immediately under the protective film may have the pattern width according to sheet resistance distribution of the resistor thin film.

In the above-mentioned method, the resistor width adjustment rate may adjust the pattern width of the resistor thin film to cancel out variation in sheet resistance values due to film thickness distribution of the resistor thin film.

In the above-mentioned method, pattern edges of the protective film and the resistor thin film immediately under the protective film may almost match.

In the above-mentioned method, in the forming of the pattern of the protective film, a photopolymer film to be the protective film is formed the resistor thin film, and the photopolymer film may be exposed by direct writing.

An aspect of the present invention is a multi-layer wiring board including a plurality of wiring layers and a plurality of resistors formed on a topmost wiring layer. The multi-layer wiring board includes: a pattern of a resistor thin film; a protective film that is disposed on the pattern of the resistor thin film; and a plating film that is disposed on the resistor thin film at a position where the protective film is not formed. The resistor thin film immediately under the protective film has pattern width according to sheet resistance distribution of the resistor thin film.

In the above-mentioned multi-layer wiring board, the resistor thin film may be formed to have the pattern width to cancel out variation in sheet resistance values due to film thickness distribution of the resistor thin film.

In the above-mentioned multi-layer wiring board, pattern edges of the protective film and the resistor thin film immediately under the protective film may almost match.

As mentioned above, according to the present invention, it is possible to provide a method for manufacturing a multi-layer wiring board and a probe card that are capable of suppressing variation in resistance values.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Figure 1:
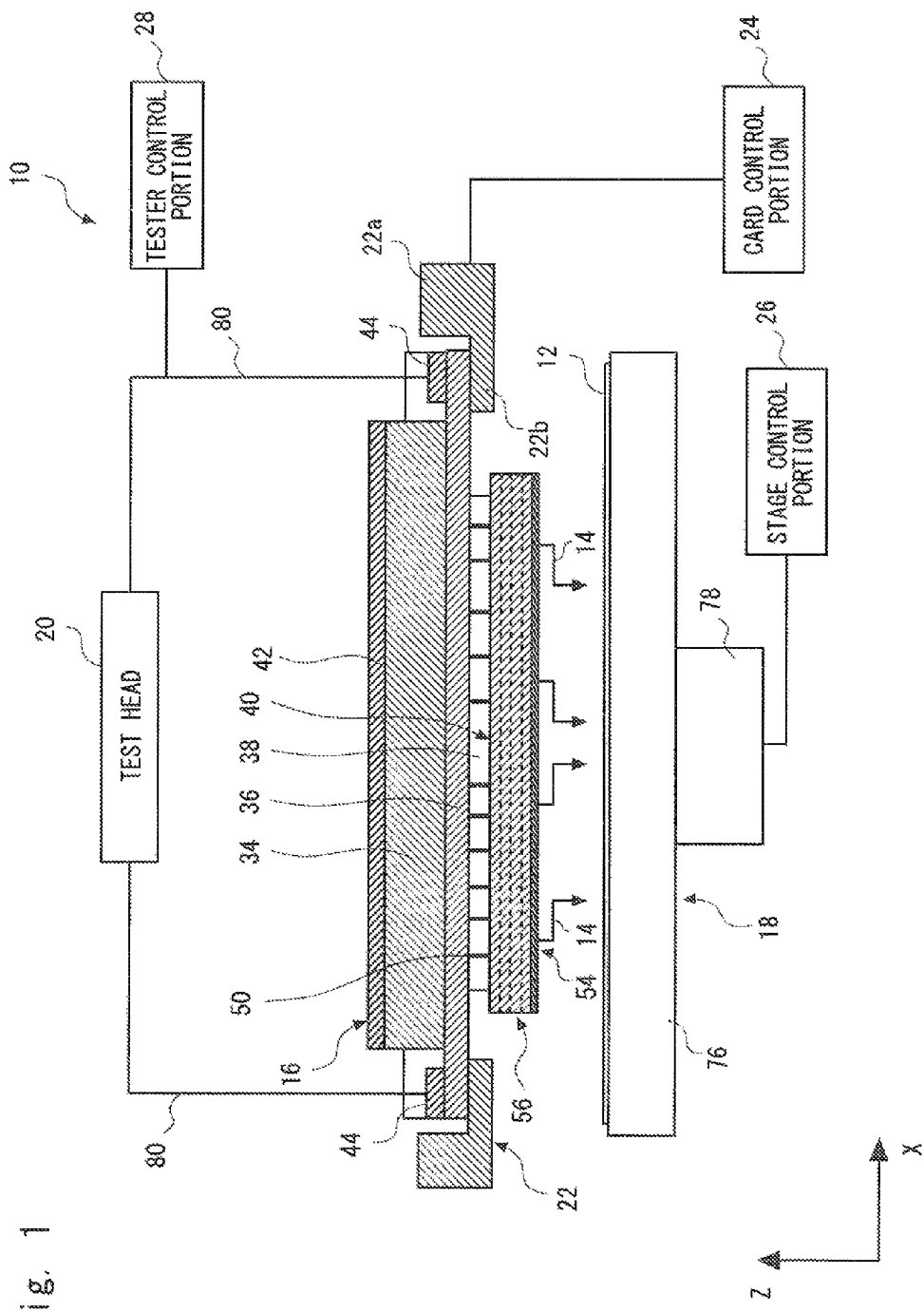
FIG. 1 shows an example of a test apparatus using a probe card.

Hereinafter, an embodiment of the present invention is explained with reference to the drawings. The following explanation illustrates a preferable embodiment of the present invention, and the scope of the present invention is not limited to the following embodiment. In the following explanation, components denoted by the same reference numerals substantially indicate the same components.

FIG. 1 shows a configuration of a test apparatus using a probe card according to this embodiment. Note that in the following explanation, a Cartesian coordinate system of XYZ axes is used. In FIG. 1, the up-down direction (vertical direction) is called Z direction, the right-left direction is called X direction, and the front-back direction is called Y direction. However, these directions are different according to the attitude of the probe base plate where multiple contacts are disposed and a state of the probe card.

Therefore, the probe card may be used in a state of being attached to the test apparatus, whether the up-down direction may be actually the vertical direction, upside-down, diagonal direction or otherwise.

Referring to FIG. 1, a test apparatus 10 tests or examines a plurality of integrated circuits formed in a wafer 12, with a circular plate-like semi-conductive wafer 12 as a device under test, at one time or in plural times Each integrated circuit may have a plurality of electrodes (not shown) such as pad electrodes on the upper surface.

The test apparatus 10 includes a probe card 16, a test head 20, a card holder 22, a card control portion 24, a stage control portion 26, and a tester control portion 28. The probe card 16 is a plate-like electrical connecting apparatus provided with a plurality of contacts 14. The test head 20 is electrically connected to the probe card 16. The wafer 12 is disposed on an inspection stage 18. The card holder 22 receives the probe card 16 at its outer rim portion to hold the probe card 16.

The card control portion 24 controls the height or inclination of the card holder 22 relative to the inspection stage 18. The stage control portion 26 controls the position of the inspection stage 18 relative to the card holder 22. The tester control portion 28 controls the test head 20 to give and receive test signals to the contacts 14 (i.e., feed signals to be fed to the integrated circuits for testing and electrical signals such as answer signals to the feed signals from the integrated circuits).

As shown in FIG. 1, each contact 14 may use a crank-shaped plate-like probe. For example, a contact 14 as described in Japanese Unexamined Patent Application Publication No. 2005-201844 may be used.

Each contact 14 may be, however, a heretofore publicly known one such as a probe made of a thin metallic wire such as tungsten line, a plate-like probe made by using photolithography technology and deposition technology, a probe with a plurality of wirings formed on one face of an electrically insulated sheet such as polyimide and with part of the wirings used as a contact, and the like.

The probe card 16 includes: a reinforcing member 34 having a flat underside; a circular flat plate-like wiring board 36 held on the underside of the reinforcing member 34; a flat plate-like electrical connector 38 disposed on the underside of the wiring board 36; a probe base plate 40 disposed on the underside of the electrical connector 38; a probe base plate 40 disposed on the underside of the electrical connector 38; and a circular cover 42 disposed on the reinforcing member 34. These members, 34 through 42, may be assembled separably and firmly with a plurality of bolts.

The reinforcing member 34 may be made of a metal material such as a stainless plate. For instance, as described in Japanese Unexamined Patent Application Publication No. 2008-145238, the reinforcing member 34 may have an inner annular portion, an outer annular portion, a plurality of connections for combining both annular portions, a plurality of extensions extended radially outward from the outer annular portion, and a central frame portion integrally continuing to the inside of the inner annular portion, and may be configured so that a gap between those portions may act as a space opening both upward and downward.

Also, as described, for example, in Japanese Unexamined Patent Application Publication No. 2008-145238, it is possible to dispose an annular thermal deformation control member for controlling thermal deformation of the reinforcing member 34 on the upside of the reinforcing member 34 and to dispose the cover 42 on the thermal deformation control member.

The wiring board 36 may be, by way of illustration, made of an electrically insulating resin such as glass-containing epoxy resin to be shaped like a disk, having a plurality of conductive paths, i.e., internal wirings (not shown), to be used for delivery of test signals to the contacts 14.

In an annular rim portion of the upside of the wiring board 36, there may be multiple connectors 44 to be connected to the test head 20. Each connector 44 may have a plurality of terminals (not shown) electrically connected to the internal wirings.

The reinforcing members 34 and the wiring board 36 may be coaxially combined by a plurality of screw members (not shown) with the underside of the reinforcing member 34 and the upside of the wiring board 36 in contact with each other.

The electrical connector 38 may be one as described in, for example, Japanese Unexamined Patent Application Publication No. 2008-145238. The electrical connector 38 may be provided with publicly-known plural connecting pins 50 such as pogo pins (each of which may have an upper pin member and a lower pin member extending, respectively, upward and downward with a spring in an electrically insulating pin holder therebetween). The internal wirings of the wiring board 36 are electrically connected to conductive paths, which will be explained later, of the probe base plate 40, respectively, by means of the connecting pins 50.

The electrical connector 38 may be combined with the underside of the wiring board 36 at the pin holder by a plurality of screw members and suitable members (neither are shown) such that the upsides of the pin holders are abutted on the underside of the wiring board 36.

Further, each of the connecting pins 50 may have the upper pin member and lower pin member with a spring therebetween. The upper pin member may be pressed against a terminal portion (not shown) continuous to the lower end of the internal wiring of the wiring board 36, while the lower pin member may be pressed against another terminal portion provided on the upside of the probe base plate 40.

The probe base plate 40 may be, by way of illustration, a base plate for combined use having a flexible multi-layer sheet 54 made of an electrically insulating resin such as polyimide resin on the underside of a multi-layer ceramic base plate 56 and the contacts 14 cantilevered on the underside of the multi-layer sheet 54.

The multi-layer sheet 54 may have various configurations, including a plurality of internal wirings (not shown) inside and a plurality of probe lands (not shown) electrically connected to the internal wirings and may be formed integrally with the ceramic base plate 56. The ceramic base plate 56 has penetration wiring that penetrates vertically through the ceramic base plate 56.

Each contact 14 may be cantilevered on the probe land with its front end (tip) projected downward by an electrically conducting bond such as soldering, welding by laser, and the like.

The card holder 22 may be made of an electrically insulating material and may have a ring-like rim portion 22*a* such as an inward flange and an upward stage portion 22*b* extending inward from the lower end portion of the rim portion 22*a*. The stage portion 22*b* may be shaped like a ring, such as an inward flange, and may receive the lower surface of the outer rim portion of the wiring board 36.

The probe card 16 may be attached to the stage portion 22*b* of the card holder 22 by a plurality of screw portions (not shown) in the extended portion 34*d* of the reinforcing member 34 and the outer rim portion of the wiring board 36 such that the outer rim portion of the wiring board 36 is received by the stage portion 22*b* and that the probe card 16 is situated under the housing of the test head 20.

The card holder 22 may be attached to the frame or the housing of the test apparatus 10 with a card support mechanism (not shown) interposed therebetween, in which the card support mechanism changes inclination of the card holder 22 relative to the inspection stage 18.

The above-mentioned card support mechanism, controlled by the card control portion 24 prior to a test, in particular, prior to a test of one lot or one wafer, changes the height or inclination of the card holder 22, eventually, of the probe card 16, relative to the inspection stage 18. Thus, the probe card 16 may be positioned at a predetermined height position relative to the wafer 12 where an imaginary tip plane formed by the tips of the contacts 14 is received in a chuck top 76.

A card support mechanism such as above is described, for example, in Japanese Unexamined Patent Application Publication Nos. 2002-14047 and 2007-183194.

The inspection stage 18 may have a stage, that is, the chuck top 76, for releasably adsorbing the wafer 12 vacuum-wise, and a chuck top moving mechanism 78 for moving the chuck top 76 three-dimensionally in the longitudinal, lateral and vertical directions relative to the probe card 16 as well as for angularly rotating about a θ-axis extending in the vertical direction.

The inspection stage 18 is moved longitudinally and laterally relative to the probe card 16 by a stage moving mechanism (not shown). Thus, the inspection stage 18 is prevented from moving longitudinally and laterally during the test of the wafer 12, but may be moved longitudinally and laterally by the stage moving mechanism for replacing the wafer for one lot to be tested.

In addition, the inspection stage 18 may be moved longitudinally and laterally by the stage moving mechanism for replacement of the wafer to be tested during the test of the wafer of one lot every time a test of wafer 12 is finished. It is, however, possible to replace the wafer 12 to be tested without moving the inspection stage 18 during the test of the wafer 12 of one lot.

Instead of providing such a stage moving mechanism as described above, a function of the chuck top moving mechanism 78 to move the chuck top 76 longitudinally and laterally may be used.

Prior to the test of the wafer 12, the chuck top moving mechanism 78, controlled by the stage control portion 26, moves the inspection stage 18 three-dimensionally and angularly rotates it about the θ-axis. Thus, the wafer 12 received by the chuck top 76 may be positioned such that an electrode of an integrated circuit provided therein is opposed to the tip of the contact 14.

When replacing the wafer to be tested, the inspection stage 18, before being moved longitudinally and laterally by the above-mentioned stage moving mechanism, may be maintained in a state that the chuck top 76 is lowered by the chuck top moving mechanism 78 to a position where the wafer 12 is not brought into contact with the contact 14.

The test head 20 may include a plurality of circuit boards where completed integrated circuits are placed on a support board like a wiring board and a box for accommodating these circuit boards, and may be disposed above the probe card 16.

In the illustration, the integrated circuit of each circuit board is electrically connected to the internal wiring of the wiring board 36 through wiring 80 and the connector 44. Thus, the integrated circuit of each circuit board, controlled by the tester control portion 28 at the time of an actual test, delivers test signals to the integrated circuit of the wafer 12 through the probe card 16.

Figure 2:
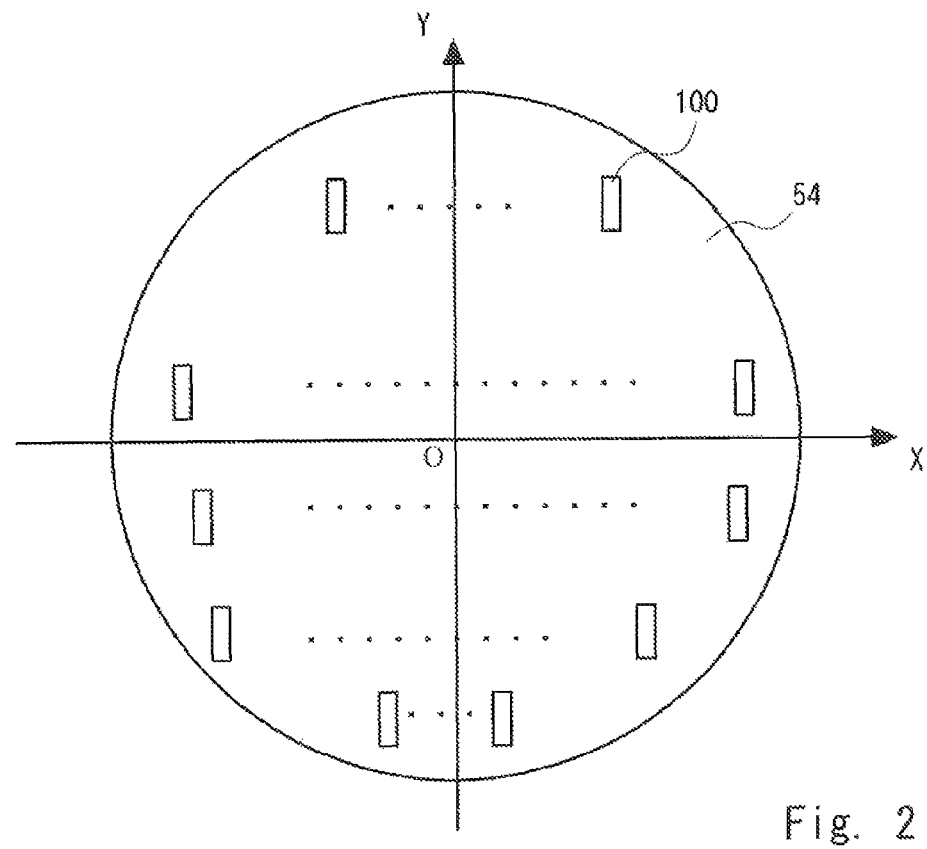
FIG. 2 is a plan view schematically showing a resistor provided on a topmost layer of the probe card.

Here, a resistor is provided on the above-mentioned multi-layer sheet 54. A configuration of the resistor is explained using FIG. 2. FIG. 2 is a plan view showing a configuration of the resistor provided on the multi-layer sheet 54 with no contacts 14. FIG. 2 shows a plane where the contacts 14 of the multi-layer sheet 54 are provided, i.e., the underside in FIG. 1.

A plurality of resistors 100 are formed above the surface of the multi-layer sheet 54. The resistors 100 are formed on a topmost wiring layer of the multi-layer sheet 54, which is a multi-layer wiring board. A plurality of patterns of the resistors 100 are formed to be interspersed on the multi-layer sheet 54. The resistors 100 are provided to match the impedance. Therefore, the patterns of the resistors 100 are formed so as to achieve desired resistance values of the resistors 100. The resistors 100 are connected to wirings made of plating films and the like. For example, the resistors 100 are formed near an end portion of the wirings.

Figure 3:
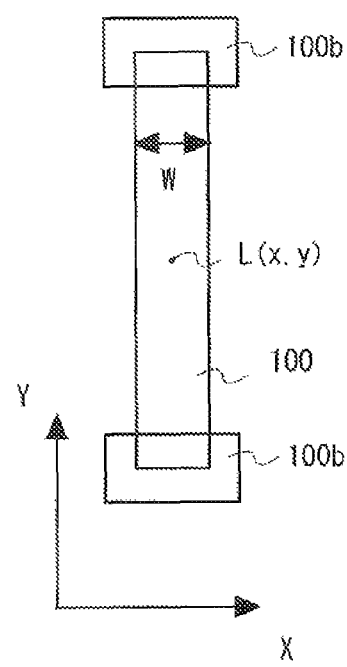
FIG. 3 is a plan view schematically showing a configuration of the resistor.

A configuration of the resistor 100 is explained here with reference to FIG. 3. FIG. 3 is a plan view schematically showing a configuration of the resistor 100. As shown in FIG. 3, resistor electrode parts 100*b* are formed to both sides of the resistor 100 in which the Y direction is the longitudinal direction. The resistors 100 are connected to wirings on the topmost layer of the multi-layer sheet 54. The resistors 100 are connected to the wirings via the resistor electrode parts 100*b*. The resistor electrode parts 100*b* may be probe lands. Here, center coordinates of the resistor 100 shall be L (x, y).

The plurality of resistors 100 as the one shown in FIG. 2 are formed so that variation in the resistance values of the resistors 100 is within a predetermined standard value. For example, with a reference resistance value of 400Ω, the plurality of resistors 100 are formed so that manufacture tolerance may be ±20% (320 Ω to 480Ω). However, when in-plane variation in the resistance values of the resistor thin film increases, the resistance values of the resultant resistors 100 will not satisfy the desired standard value. Therefore, width W of the resistors 100 is adjusted (see FIG. 3) to suppress the variation in the resistance values of the resistors 100.

Figure 4:
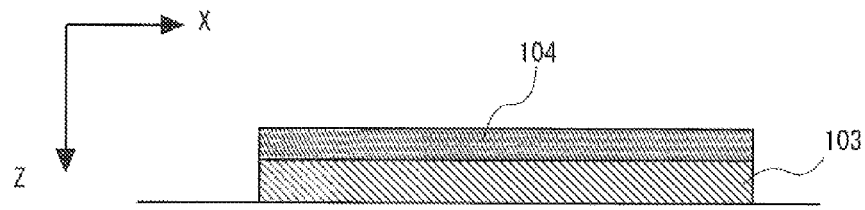
FIG. 4 is a cross-sectional diagram schematically showing a configuration of the resistor.
Figure 5:
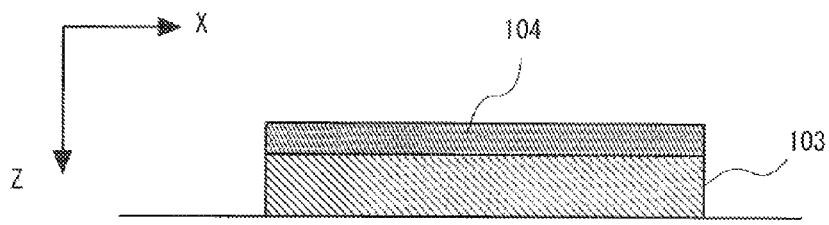
FIG. 5 is a cross-sectional diagram schematically showing a configuration of the resistor.

Hereinafter, the method for suppressing the variation in the resistances value is explained using FIGS. 4 and 5. FIGS. 4 and 5 show a cross-sectional structure of the resistor 100. As shown in FIG. 4, the resistor 100 includes a resistor thin film 103 and a protective film 104. The protective film 104 is disposed above the resistor thin film 103. The protective film 104 is formed to have almost the same width as the resistor thin film 103. That is, edges of the resistor thin film 103 and the protective film 104 are aligned at the same position.

The resistor thin film 103 is a conductor having predetermined resistivity. As the resistor thin film 103, Cr, NiP, NiCr, NiBm, Ni, Ta, TaN, Ti, TiO, or an alloy material thereof can be used, for example. The protective film 104 is an insulating resin film made of polyimide or the like.

The resistor thin film 103 is formed by the sputtering method, the evaporation method and the like. Note that it is not limited to the sputtering method and the evaporation method, but the electroless plating method, the electrolytic plating method, the nanopaste coating method, or a method combining those methods may be used. There is in-plane variation in the thickness of the resistor thin film 103. That is, the thickness of the resistor thin film 103 differs according to the position (XY coordinates) of the multi-layer sheet 54. For example, in FIG. 4, the film thickness of the resistor thin film 103 is smaller than the resistor thin film 103 of FIG. 5. The thinner the resistor thin film 103, the greater the resistance value.

Therefore, in this embodiment, the resistor thin film 103 with small thickness is formed to be wider than the resistor thin film 103 with large thickness. That is, in order to achieve uniform resistance distribution, the width of the resistor thin film 103 varies according to the position on the multi-layer sheet 54. The width of the resistor thin film 103 is adjusted according to XY coordinates of the resistor 100 on the multi-layer sheet 54. The pattern width of the resistor thin film 103 is adjusted to cancel out the variation in the resistance values caused by the difference in film thickness. Then, the cross-sectional area of the resistor thin film 103 can be made constant, thereby suppressing the in-plane variation in the resistance values.

Next, the method for forming the resistor 100 according to this embodiment is explained using FIGS. 6 to 10. FIGS. 6 to 10 are process step sectional diagrams showing a manufacturing process of the resistor 100.

Figure 6:
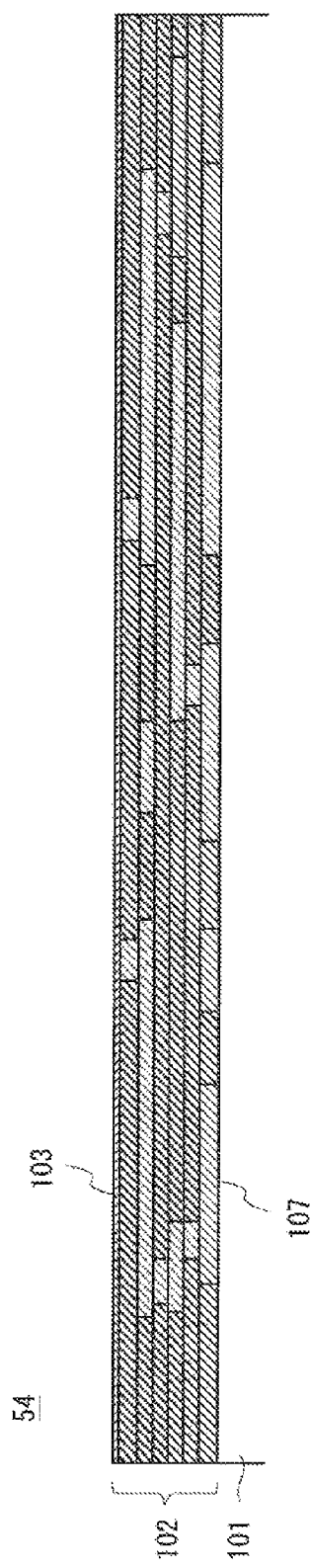
FIG. 6 is a process step sectional diagram showing a manufacturing process of a multi-layer wiring board.

As shown in FIG. 6, the multi-layer sheet 54 includes a base material 101, which is the ceramic base plate 56, and a multi-layer wiring layer 102 provided on the base material 101. A multi-layer internal wiring 107 is formed in the multi-layer wiring layer 102. For example, the multi-layer sheet 54 is formed by laminating an inorganic metal layer and an organic insulating layer on the ceramic base plate 56. The multi-layer sheet 54 as described above is prepared. Prior to forming the resistor thin film 103, IBE (Ion Beam Etching) processing may be performed on the surface of the multi-layer sheet 54. This roughens the surface layer of the multi-layer sheet 54 to thereby improve adhesion to the resistor thin film 103.

Then, the resistor thin film 103 is formed on the multi-layer wiring layer 102 as shown in FIG. 6. The resistor thin film 103 is formed as mentioned above using the sputtering method and the like. The resistor thin film 103 is formed on almost a whole surface of the multi-layer sheet 54. Then, the sheet resistance distribution of the resistor thin film 103 is measured. For example, sheet resistance of the resistor thin film 103 is measured at a constant interval. That is, the sheet resistance is measured while shifting the position in the X or Y direction to measure the two-dimensional distribution of the sheet resistance of the resistor thin film 103.

Then, an arithmetic expression for obtaining an adjustment rate M is derived based on the sheet resistance distribution of the resistor thin film 103. The adjustment rate M is a value for adjusting the pattern width of the resistor 100. The expression for obtaining the adjustment rate M can be, for example, defined as shown in the expression (1) below.

$$M = |X| \times B + |Y| \times C + R \times D + X^2 \times E + Y^2 \times F + A \quad (1)$$

Here, X and Y are an X coordinate and a Y coordinate, respectively. Specifically, $|X|$ is an absolute value of an X coordinate of the resistor 100, and $|Y|$ is an absolute value of a Y coordinate of the resistor 100. $X^2$ is a square of an X coordinate of the resistor 100, and $Y^2$ is a square of a Y coordinate of the resistor 100. R is a distance from an origin O to the center of the resistor 100. Note that as shown in FIG. 2, the origin of XY coordinates of the resistor 100 is a center of the resistor 100 as shown in FIG. 2.

A, B, C, D, E, and F are arbitrary coefficients. The coefficients A to F are calculated using a measurement result of the sheet resistance values. For example, the coefficients A to F can be calculated by regression analysis based on measurement data of the sheet resistance values. Specifically, the coefficients A to F are calculated from the sheet resistance values using a regression expression where M in the expression (1) is obtained by (resistance value)/(average value of total resistance values). Here, M is a value indicating a resistance value of the resistor thin film 103 provided that the resistance value width is constant. As the regression analysis, the least squares method can be used, for example. The XY coordinates and sheet resistance value data obtained after the sheet resistance measurement are substituted into the expression (1), and the coefficients A to F are calculated to have the smallest error in the measurement results.

In the above-mentioned manner, after the coefficients A to F are calculated, XY coordinates at the position to form the resistor 100 is substituted into the expression (1) so as to calculate the adjustment rate M of resistor width. Thus, the adjustment rate M according to XY coordinates of the resistor 100 can be calculated. In this way, the adjustment rate M for each resistor 100 can be calculated. The resistor width is calculated using the adjustment rate M and a resistor reference width. Here, the calculation can be performed by the expression, resistor width=adjustment rate M×resistor reference width. The resistor reference width is the pattern width of a reference resistor 100. Then, the resistor width is increased or reduced based on the resistor reference width. For example, with the resistor reference width of 55 μm, when the adjustment rate M of the resistor width is 97%, the resistor width is 53.4 μm and when the adjustment rate M of the resistor width is 104%, the resistor width is 57.2 μm.

The adjustment rates M of all the resistors 100 are calculated, and whole area allocation data for adjusting resistor width is obtained for each of the resistors 100. As described above, the thinner the film of the resistor 100, the greater the sheet resistance value. Therefore, in the resistor with the film thickness smaller than reference film thickness, the resistance value will be greater than the reference resistance value, thereby increasing the adjustment rate M. Therefore, the resistor width becomes greater than the reference resistor width. Meanwhile, in the resistor with thickness greater than the reference film thickness, the resistance value becomes smaller, thereby reducing the adjustment rate M. Accordingly, the resistor width will be smaller than the reference resistor width. In this way, the in-plane variation in the resistance values of the resistors 100 can be reduced. That is, the width of the resistor thin film 103 is adjusted so as to cancel out the variation in the resistance values caused by the difference in film thickness. The whole area allocation data for adjusting the resistor width can be obtained according to the sheet resistance distribution of the resistor 100. The whole area allocation data includes adjustment rates M for all the positions. Note that the coefficients A to F and the adjustment rate M are calculated by a processing unit such as a personal computer. A processing unit may automatically calculate the coefficients A to F and the adjustment rate M using a measurement result.

Figure 7:
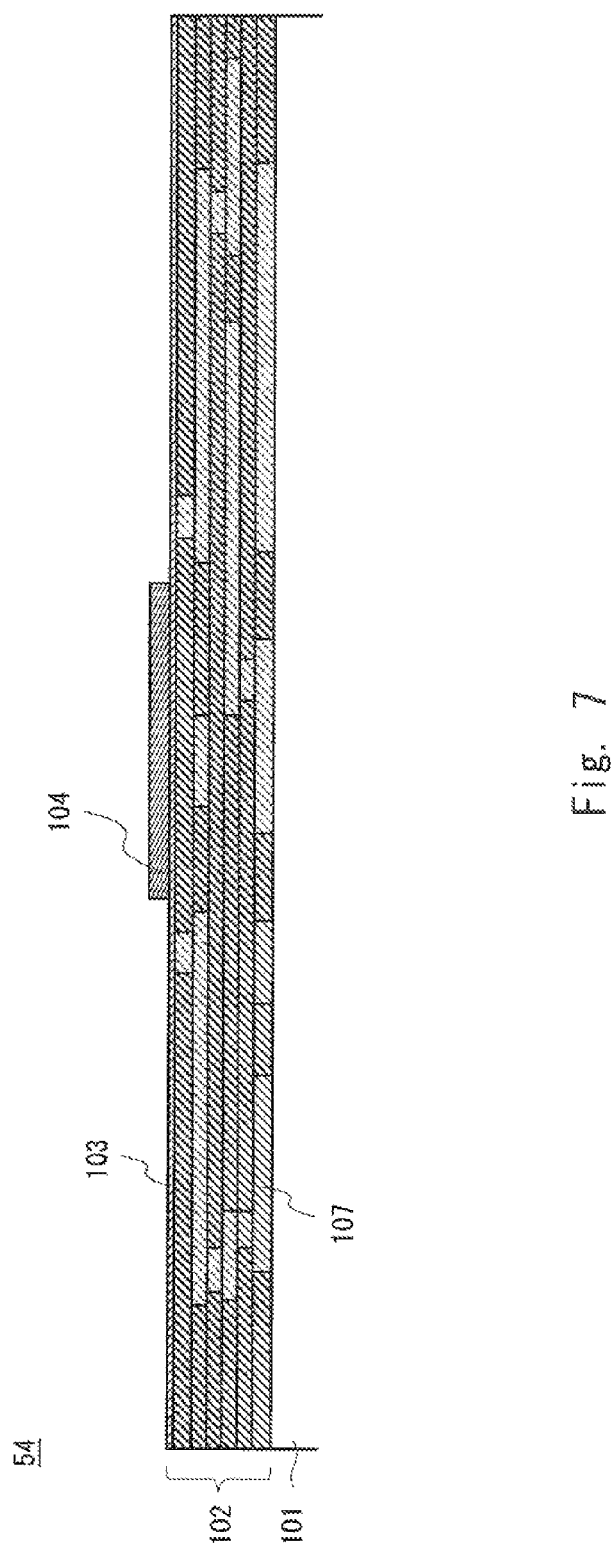
FIG. 7 is a process step sectional diagram showing the manufacturing process of the multi-layer wiring board.

After the whole area allocation data is calculated, patterns of the protective film 104 are formed on the resistor thin film 103 (see FIG. 7). A polyimide film is used as the protective film 104. For example, the whole multi-layer sheet 54 is coated with polyimide, which is photosensitive resin. The coated polyimide film is cured in an oven, for example, and exposed by direct writing. Here, a direct writing apparatus exposes the protective film 104 based on the whole area allocation data. When the exposed protective film 104 is developed, parts of the protective film 104 irradiated with light is melt. Then, the pattern of the protective film 104 as the one shown in FIG. 7 is formed.

The protective film 104 is formed at the positions where the resistors 100 are formed. Here, the plurality of patterns of the protective film 104 that are formed on the resistor thin film 103 each have pattern width according to the adjustment rates M. That is, the patterns of the protective film 104 are formed having pattern width corresponding to the pattern width of the resistor thin film 103. The protective film 104 is formed on the resistor thin film 103 and is formed at the positions where a plating film 106, which is described later, is not formed.

Figure 8:
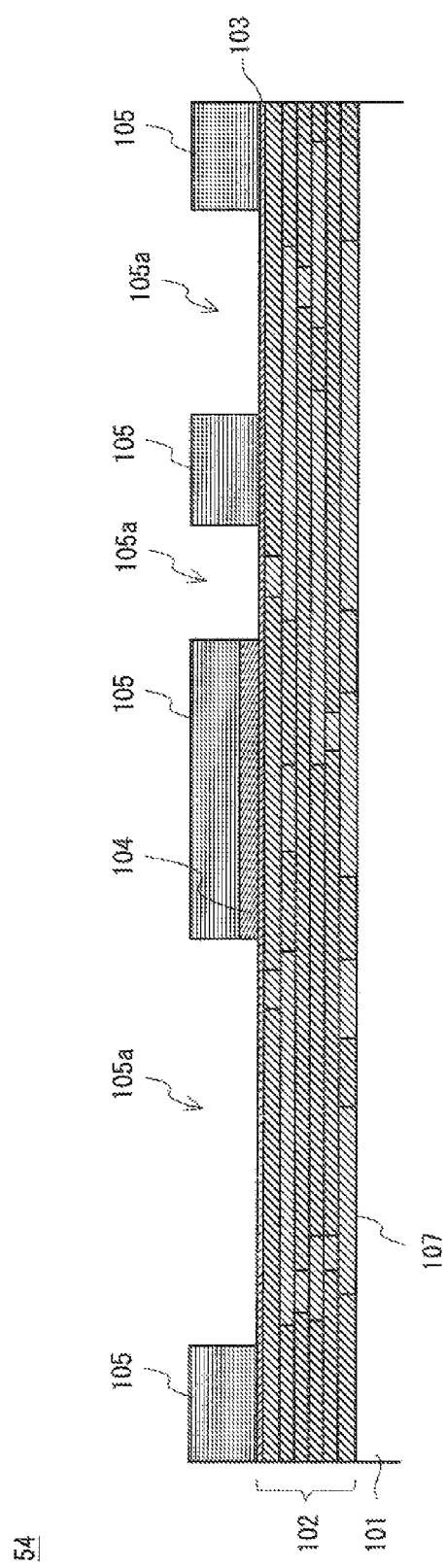
FIG. 8 is a process step sectional diagram showing the manufacturing process of the multi-layer wiring board.

Next, a resist pattern 105 is formed on the resistor thin film 103 and the protective film 104 (see FIG. 8). For example, after applying resist, which is photopolymer by spin coating, for example, and exposed by a direct writing apparatus. After the resist is developed, the resist pattern 105 as shown in FIG. 8 is formed. In openings 105a of the resist pattern 105, the resistor thin film 103 is exposed. The resist pattern 105 is formed at the positions where wirings are not formed. The resist pattern 105 is directly formed on the protective film 104 and the resistor thin film 103. At the positions where the resistors 100 are formed, the resist pattern 105 is directly formed on the protective film 104.

Figure 9:
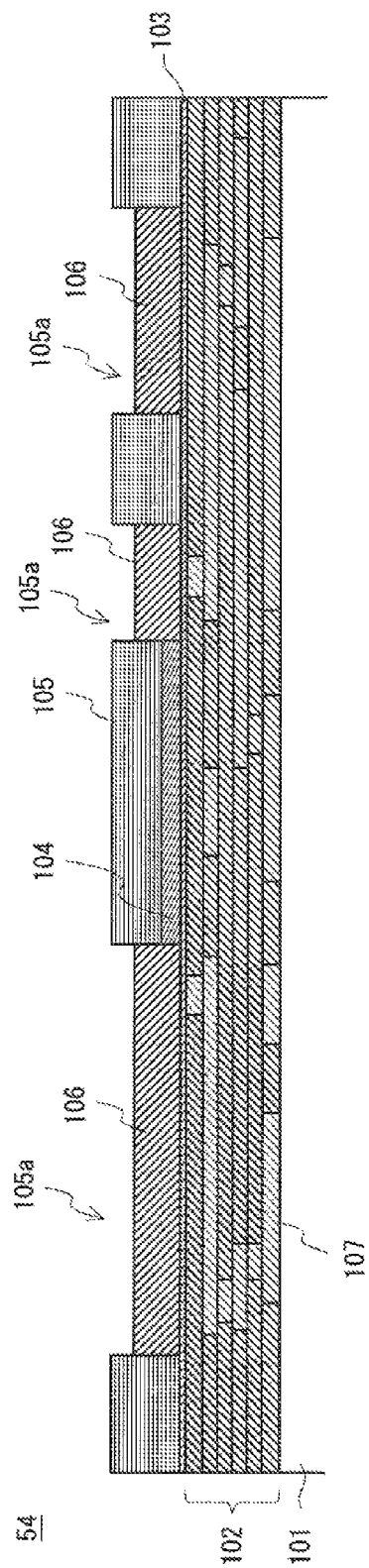
FIG. 9 is a process step sectional diagram showing the manufacturing process of the multi-layer wiring board.

Then, the plating film 106, which is wirings on the topmost layer, is formed using the resist pattern 105 as a mask (see FIG. 9). The plating film 106 is directly formed on the resistor thin film 103 and is conductive with the resistor thin film 103. The plating film 106 is formed to have predetermined thickness in the openings 105a of the resist pattern 105. The plating film 106 is thicker than the resistor thin film 103. Here, the plating film 106 can be formed by the electrolytic plating method and the electroless plating method, for example. Note that patterns of the plating film 106 are formed on the resistor thin film 103 using the resistor thin film 103 as a seed layer of plating processing. Then, the plating film 106 is disposed on the resistor thin film 103 at the positions where the protective film 104 and the resist pattern 105 are not formed. In this way, the plating film 106 to be the wirings on the topmost layer is formed. Moreover, the plating layer 106 is connected to the internal wiring 107.

Figure 10:
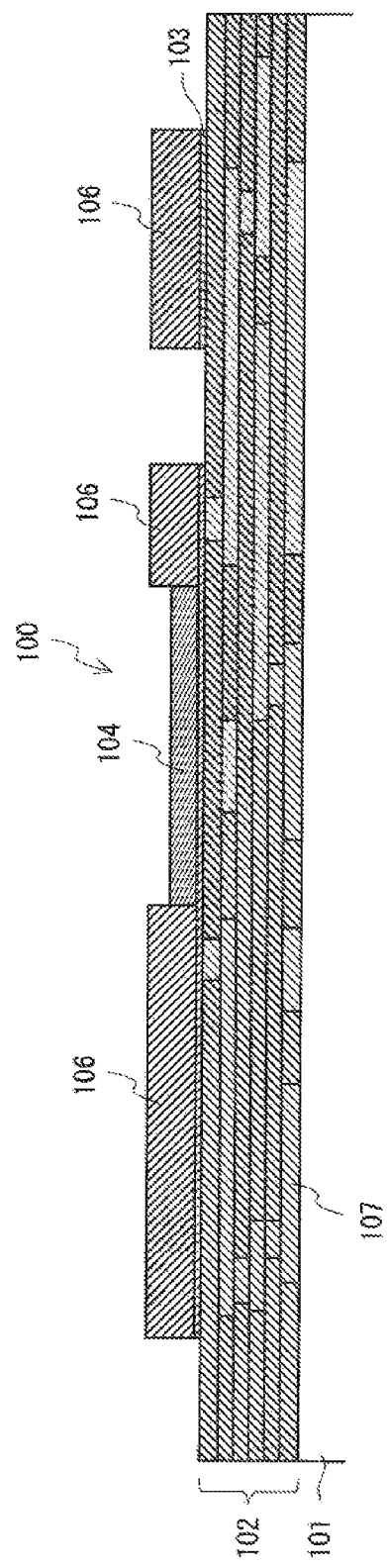
FIG. 10 is a process step sectional diagram showing the manufacturing process of the multi-layer wiring board.

After the patterns of the plating film 106 are formed, the resist pattern 105 is removed. Followed by the removal of the resist pattern 105, the resistor thin film 103 exposed from the protective film 104 and the resist 105 is removed. Then, the resistor thin film 103 is patterned as shown in FIG. 10. The resistor thin film 103 at the positions where the protective film 104 or the plating film 106 are not formed is etched. Note that the resistor thin film 103 can be etched by dry etching or wet etching. Here, the resistor thin film 103 is etched by the method not influencing the plating film 106 and the protective film 104. The resistor thin film 103 is connected to the internal wiring 107 via the plating film 106.

As has been explained so far, the width of the protective film 104 and the resistor thin film 103 is adjusted according to the distribution of the sheet resistance values. The resistor thin film 103 immediately under the protective film 104 has the pattern width according to the sheet resistance distribution of the resistor thin film 103. In other words, the resistor width adjustment rate M adjusts the resistor thin film so as to cancel out the variation in the sheet resistance values due to film thickness distribution of the resistor thin film 103. This enables suppression of the variation in the resistance values. For example, resistance values can be kept within a standard value of ±20% of arbitrary reference resistance values. Therefore, deviation from the reference resistance value of the resistor thin film 103 can be suppressed.

In this embodiment, the protective film 104 is patterned according to the whole area allocation data. Then, the resist pattern 105 is formed on the patterned protective film 104. The plating film 106 is formed using the resist pattern 105 as a mask. The resistor thin film 103 is patterned using the plating film 106 and the protective film 104 as a mask. Then, the protective film 104 or the plating film 106 is formed on the resistor thin film 103. This prevents the resistor thin film 103 from being exposed to air, thereby preventing temporal degradation of the resistor thin film 103.

The resist pattern 105 is continuously formed after the patterns of the protective film 104 are formed. Then, the resistor thin film 103 and the plating film 106 can be formed by a simple configuration. In this process, the resistor thin film 103 has almost the same width as the protective film 104. That is, the pattern edges of the protective film 104 and the resistor thin film 103 immediately under the protective film 104 almost match. Moreover, the resistor thin film 103 is present under the plating film 106 and the protective film 104. In other words, the plating film 106 and the protective film 104 are disposed on the resistor thin film 103 without running off the edge of the resistor thin film 103.

Note that the expression to calculate the adjustment rate M is not limited to the expression (1). Further note that although the above explanation mentioned the multi-layer wiring board used for the probe card 16, the above resistor 100 may be formed over the multi-layer wiring board used for other than probe card.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method for manufacturing a multi-layer wiring board including a plurality of wiring layers and a plurality of resistors formed on a topmost wiring layer, the method comprising:
   forming a resistor thin film;
   measuring resistance distribution of the resistor thin film;
   calculating resistor width adjustment rates of the plurality of resistors according to the resistance distribution;
   forming a pattern of a protective film above the resistor thin film, the pattern of the protective pattern having pattern width according to the resistor width adjustment rate;
   forming a pattern of a plating film above the resistor thin film at a position exposed from the protective film; and
   etching the resistor thin film at a position exposed from the plating film and the protective film so as to pattern the resistor thin film.

2. The method according to claim 1, wherein in the forming of the pattern of the plating film,
  a resist pattern is formed above the protective film and the resistor thin film, and
  the plating film is formed in an opening of the resist pattern.

3. The method according to claim 1, wherein the resistor thin film immediately under the protective film has the pattern width according to sheet resistance distribution of the resistor thin film.

4. The method according to claim 1, wherein the resistor width adjustment rate adjusts the pattern width of the resistor thin film to cancel out variation in sheet resistance values due to film thickness distribution of the resistor thin film.

5. The method according to claim 1, wherein pattern edges of the protective film and the resistor thin film immediately under the protective film almost match.

6. The method according to claim 1, wherein in the forming of the pattern of the protective film, a photopolymer film to be the protective film is formed on the resistor thin film, and the photopolymer film is exposed by direct writing.

\* \* \* \* \*